United States Patent
Lowrey et al.

(10) Patent No.: US 6,625,054 B2
(45) Date of Patent: Sep. 23, 2003

(54) METHOD AND APPARATUS TO PROGRAM A PHASE CHANGE MEMORY

(75) Inventors: Tyler Lowrey, San Jose, CA (US); Manzur Gill, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 10/034,146

(22) Filed: Dec. 28, 2001

(65) Prior Publication Data

US 2003/0123277 A1 Jul. 3, 2003

(51) Int. Cl.[7] .................. G11C 11/00; G11C 11/56
(52) U.S. Cl. ................. 365/148; 365/163; 365/168
(58) Field of Search ................. 365/100, 148, 365/163, 168, 185.03

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 5,296,716 A | 3/1994 | Ovshinsky et al. |
| 5,789,758 A | 8/1998 | Reinberg |
| 5,879,955 A | 3/1999 | Gonzalez et al. |
| 5,883,827 A * | 3/1999 | Morgan ............ 365/100 |
| 5,920,788 A | 7/1999 | Reinberg |
| 5,933,365 A | 8/1999 | Klersy et al. |
| 5,970,336 A | 10/1999 | Wolstenholme et al. |
| 5,998,244 A | 12/1999 | Wolstenholme et al. |
| 6,002,140 A | 12/1999 | Gonzalez et al. |
| 6,031,287 A | 2/2000 | Harshfield |
| 6,085,341 A | 7/2000 | Greason et al. |
| 6,087,674 A | 7/2000 | Ovshinsky et al. |
| 6,141,241 A | 10/2000 | Ovshinsky et al. |
| 6,153,890 A | 11/2000 | Wolstenholme et al. |
| 6,229,157 B1 | 5/2001 | Sandhu |
| 6,487,113 B1 * | 11/2002 | Park et al. ............ 365/163 |

OTHER PUBLICATIONS

U.S. patent application, pending, Tyler Lowrey, 09/895,135, filed Jun. 29, 2001.
U.S. patent application, pending, Lowrey et al., 10/021,469, filed Oct. 30, 2001.

\* cited by examiner

Primary Examiner—Son Mai
(74) Attorney, Agent, or Firm—Blakely, Sokoloff, Taylor & Zafman LLP

(57) ABSTRACT

Briefly, in accordance with an embodiment of the invention, a method and an apparatus to program a multi level cell (MLC) phase change material is provided.

37 Claims, 8 Drawing Sheets

METHOD AND APPARATUS TO PROGRAM A PHASE CHANGE MEMORY

BACKGROUND

A phase change material may be used in a memory cell to store a bit of data. Phase change materials that are used in memory devices may exhibit at least two different states. These states may be referred to as the amorphous and crystalline states. These states may be distinguished because the amorphous state generally exhibits higher resistivity than the crystalline state. Generally, the amorphous state involves a more disordered atomic structure.

Rectangular current pulses may be used to program the phase change material to a desired state. The amplitude of the current pulse may be varied to change the resistance of the phase change material. However, variations in the materials, fabrication processes, and operating environment may cause the resulting resistance in different memory cells of a memory array to vary for a given rectangular current pulse. Thus, when programming multiple memory cells in a memory array, due to these variations, some cells may be programmed to one state, while others may be programmed to a different state when the same rectangular pulse is applied to each memory cell, or some cells while programmed to the desired state may not have adequate sense margins.

Thus, there is a continuing need for better ways to program memory cells in memory systems using phase change materials.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
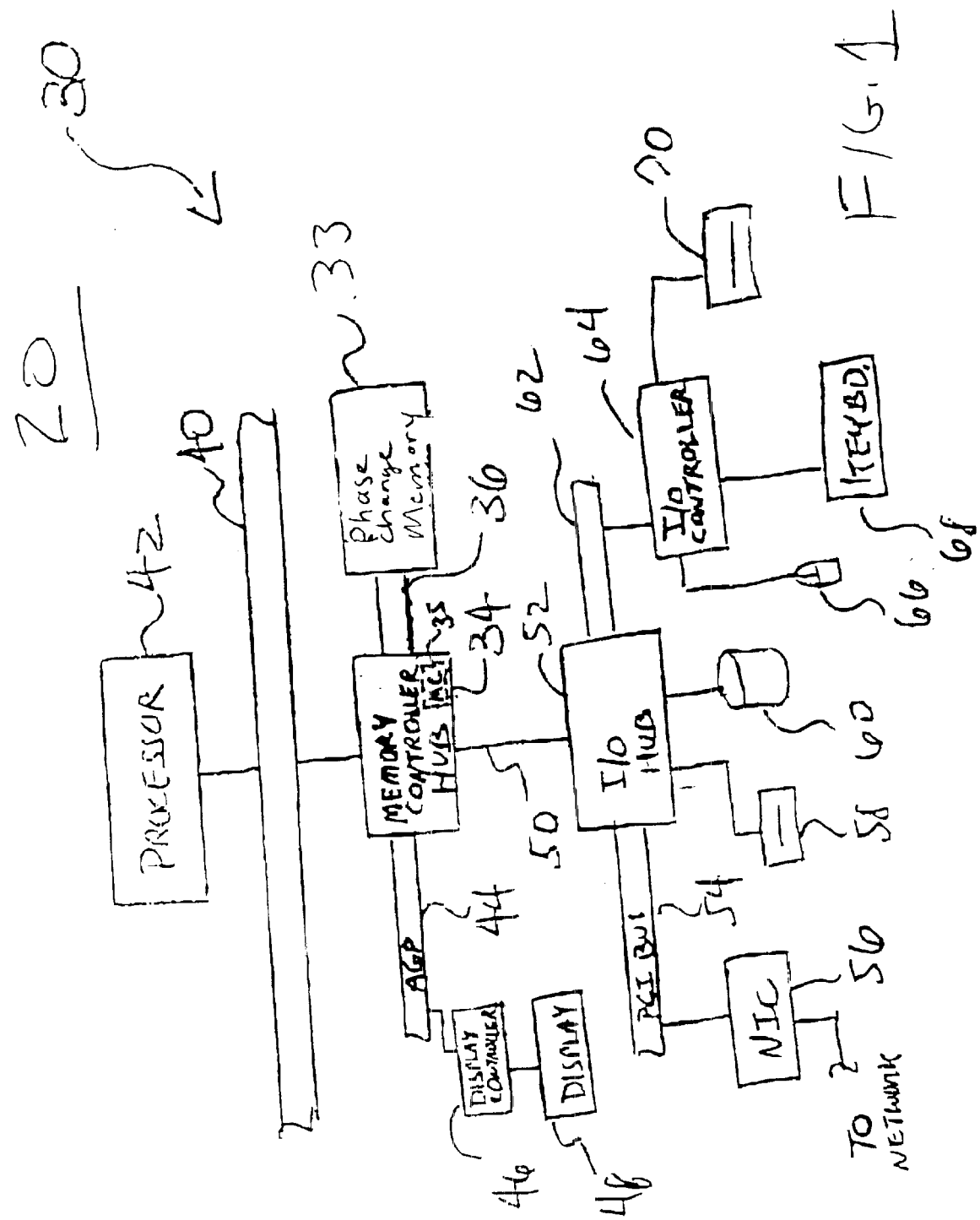
FIG. 1 is a block diagram of a computing system in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, an embodiment 20 in accordance with the present invention is described. Embodiment 20 may comprise a computing system 30. Computing system 30 may be used in a variety of portable electronic systems such as, for example, a portable communication device (e.g., a mobile cell phone), a two-way radio communication system, a one-way pager, a two-way pager, a personal communication system (PCS), a portable computer, a personal digital assistant (PDA), or the like. Although it should be pointed out that the scope and application of the present invention is in no way limited to these examples. For example, other applications where the present invention may be used are nonportable electronic applications, such as in cellular base stations, servers, desktop computers, video equipment, etc.

In this embodiment, computing system 30 may comprise a processor 42 that is connected to a system bus 40. Although the scope of the present invention is not limited in this respect, processor 42 may comprise, for example, one or more microprocessors, digital signal processors, microcontrollers, or the like. System bus 40 may be a data path comprising, for example, a collection of data lines to transmit data from one part of computing system 30 to another.

Computing system 30 may further include a memory controller hub 34 connected to system bus 40 and a display controller 46 coupled to memory controller hub 34 by an accelerated graphics port (AGP) bus 44. Display controller 46 may generate signals to drive a display 48.

Memory controller hub 34 may also be coupled to an input/output (I/O) hub 52 via a hub interface 50. I/O hub 52 may control operation of a CD-ROM drive 58 and may control operation of a hard disk drive 60. In addition, I/O hub 52 may provide interfaces to, for example, a peripheral component interconnect (PCI) bus 54 and an expansion bus 62. PCI bus 54 may be connected to a network interface card (NIC) 56. An I/O controller 64 may be connected to expansion bus 62 and may control operation of a floppy disk drive 70. In addition, I/O controller 64 may receive input from a mouse 66 and a keyboard 68.

Computing system 30 may also include a phase change memory 33 coupled to memory controller hub 34 via a memory bus 36. Memory controller hub 34 may include a memory controller 35 that may serve as an interface between memory bus 36 and system bus 40. Memory controller 35 may generate control signals, address signals, and data signals that may be associated with a particular write or read operation to phase change memory 33. Memory bus 36 may include communication lines for communicating data to and from phase change memory 33 as well as control and address lines used to store and retrieve data to and from phase change memory 33. A particular write or read operation may involve concurrently writing data to or reading data from phase change memory 33.

Although the scope of the present invention is not limited in this respect, phase change memory 33 may be a memory array comprising a plurality of memory cells that may include a phase change memory material such as, for example, a chalcogenide material that may be programmed into different memory states to store data. This material may be, for example, a chalcogenide alloy that exhibits a reversible structural phase change from an amorphous state to a crystalline or a polycrystalline state. Due to the reversible structure, the phase change material may change from the amorphous state to the crystalline state and may revert back to the amorphous state thereafter, or vice versa, in response to temperature changes. A polycrystalline state may be defined as a state where multiple grain crystals are present with the possibility of some portions of the phase change material remaining amorphous.

A variety of phase change alloys may be used. For example, a chalcogenide alloy containing one or more elements from Column VI of the periodic table may be used in phase change memory 33. By way of example, phase change memory 33 may comprise GeSbTe alloys.

A volume of the chalcogenide alloy may be integrated into a memory cell to allow the cell to act as a nonvolatile programmable resistor, which reversibly changes between higher and lower resistance states. Crystallization in phase change materials may be a result of both the temperature and the amount of time the material spends at that temperature. Accordingly, the phase change may be induced by resistive heating using a current flowing through the phase change material. The programmable resistor may exhibit greater than 40 times dynamic range of resistivity between the crystalline state (low resistivity) and the amorphous state (high resistivity), and may also be capable of exhibiting multiple, intermediate states that allow multi-bit storage in a memory cell. The data stored in the cell may be read by measuring the cell's resistance.

By way of example, in a binary system storing one bit of data, a first state may be defined as the "1" state or set state and a second state may be defined as the "0" state or the reset state, wherein the reset state may be defined as a substantially amorphous state and the set state may be defined as a substantially crystalline state, although the scope of the present invention is not limited in this respect.

In multi level cell (MLC) operation, a phase change material may be used to exhibit multiple states to store multiple bits of data, wherein changing the state of a phase change memory material having more than two states may be accomplished by changing the resistivity/conductivity of the phase change material. For purposes of illustration, the embodiments herein describe binary systems that store 2-bits per memory cell using four states. A (0,0) state may be defined as a substantially amorphous (high resistivity) state; a (1,1) state may be defined as a substantially crystalline (low resistivity); and a (0,1) state and a (1,0) state may be intermediate states between the substantially amorphous and substantially crystalline states. These intermediate states may be referred to as heterogeneous states. As an example, the four states of the phase change material may be defined to have the following resistive relationship: the resistance of the phase change material in state (0,0) may be greater than the resistance of the phase change material in state (0,1); the resistance of the phase change material in state (0,1) may be greater than the resistance of the phase change material in state (1,0); and resistance of the phase change material in state (1,0) may be greater than the resistance of the phase change material in state (1,1). In other words, the conductivity of the phase change material in state (0,0) may be less than the conductivity of the phase change material in state (0,1), the conductivity of the phase change material in state (0,1) may be less than the conductivity of the phase change material in state (1,0), and conductivity of the phase change material in state (1,0) may be less than the conductivity of the phase change material in state (1,1).

Although a binary 2-bit per cell system is described for purposes of illustration, the scope of the present invention is not limited in this respect. The principles of the present invention may be similarly applicable to any system where the phase change memory material has more than two states. For example, in a nonbinary system, the memory states can be three or some other multiple of a nonbinary base.

Figure 2:
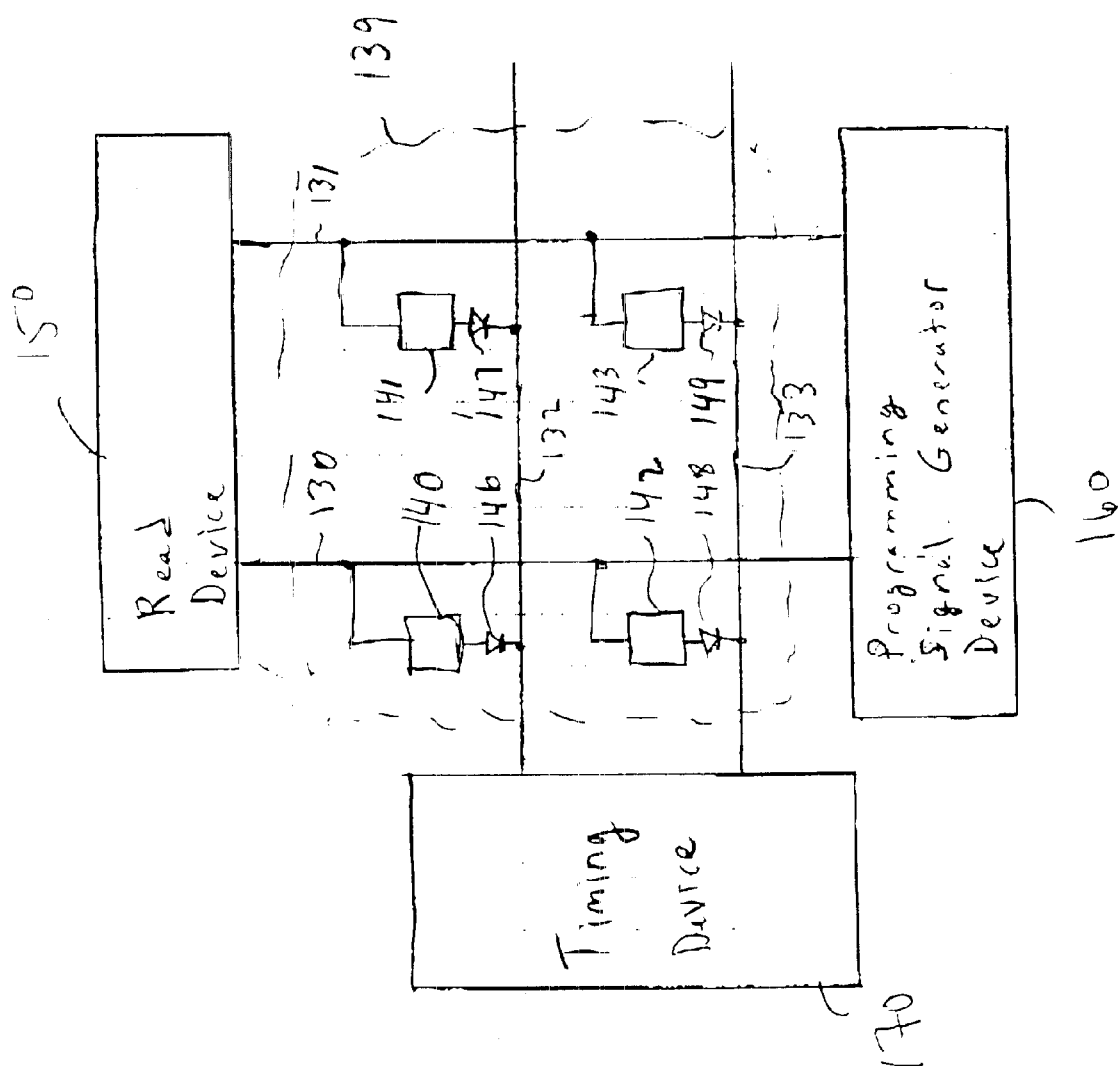
FIG. 2 is schematic diagram of a phase change memory in accordance with an embodiment of the present invention.

Turning to FIG. 2, an embodiment of phase change memory 33 in accordance with the present invention is described. Phase change memory 33 may include a 2×2 array 139 of memory cells 140, 141, 142, and 143, wherein memory cells 140–143 comprise a phase change material. Although a 2×2 array 139 is illustrated in FIG. 2, the scope of the present invention is not limited in this respect. For example, phase change memory 33 may have a larger array of memory cells.

Phase change memory 33 may include column lines 130 and 131 and row lines 132 and 133 to select a particular cell of array 139 for a write or read operation. The write operation may also be referred to as a programming operation. Memory cells 140–143 may be connected to column lines 130 and 131 and may be coupled through switches (e.g., diodes 146, 147, 148, and 149) to row lines 132 and 133. Therefore, when a particular memory cell (e.g., memory cell 140) is selected, its associated column line (e.g., 130) may be driven high and its associated row line (e.g., 132) may be driven low to drive current through the memory cell.

In this embodiment, phase change memory 33 further comprises a programming signal generator device 160 to perform a write operation, a read device 150 to perform a read operation, and a timing device 170 to generate timing signals to assist in the read and write operations. In MLC operation, read device 150 may also be used to verify status of memory cells 140–143 during programming. For example, read device 150 may be used to determine whether the memory material in a memory cell is in a selected state of the more than two states after a programming signal is applied to the memory cell.

Programming signal generator device 160 may be adapted to generate programming signals to apply to memory cells 140–143. For example, device 160 may be adapted to generate and apply the programming signals illustrated in FIGS. 3–6.

Figure 3:
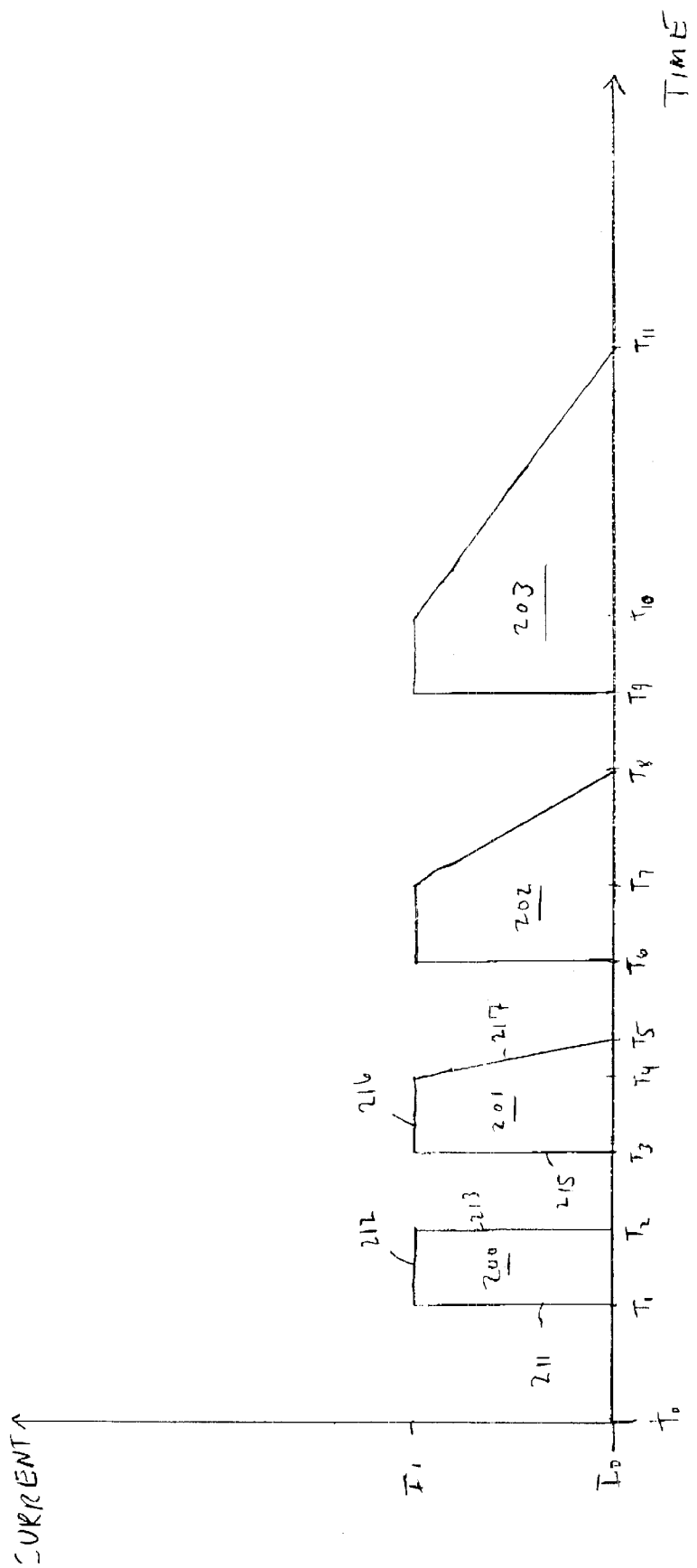
FIG. 3 illustrates a plurality of programming signals in accordance with an embodiment of the present invention.

Turning to FIG. 3, a plurality of programming signals (200, 201, 202, 203) in accordance with an embodiment of the present invention are illustrated. In FIG. 3, different times $T_0$–$T_{11}$ are denoted on a TIME axis and different currents $I_0$ and $I_1$ are denoted on a CURRENT axis.

In this embodiment, signals 200–203 have leading portions that occur prior to or when the signals reach their maximum level (e.g., $I_1$), trailing portions that occur after the signals reach their maximum level, and intermediate portions between the leading and trailing portions. For example, signal 200 has a leading portion 211, an intermediate portion 212, and a trailing portion 213 and signal 201 has a leading portion 215, an intermediate portion 216, and a trailing portion 217.

In this embodiment, signals 200–203 are current pulses having different fall times. The fall time of a signal may be defined as the time that the trailing portion decreases from a maximum level to a minimum level. In alternate embodiments, the fall time may be defined as the time that the trailing portion decreases from 90% of the maximum level to 10% of the maximum level. As an example, the fall time of signal 201 is the time it takes for trailing portion 217 to decrease from a maximum current amplitude of $I_1$ to a minimum current amplitude of $I_0$, that is, the fall time is the difference between times $T_5$ and $T_4$.

In this embodiment, signal 200 may have a fall time of substantially zero since the trailing portion of signal 200 decreases from its maximum amplitude ($I_1$) to its minimum amplitude ($I_0$) at time $T_2$. Signal 200 is a substantially rectangular pulse and signals 201, 202, and 203 are substantially nonrectangular pulses. Pulses 201, 202, and 203 may also be referred to as triangular pulses. Pulses 200, 201, 202, and 203 have successively greater fall times. That is, signal 201 has a fall time greater than the fall time of signal 200 and less than the fall time of signal 202, and signal 203 has a fall time greater than the fall time of signal 202. In this example, signal 200 may have rise and fall times of approximately zero (e.g., less than 2 nanoseconds), and may have a maximum current amplitude (e.g., $I_1$) of approximately 3 milliamps. Signal 201 may have a maximum current amplitude of approximately 3 milliamps, a rise time of approximately zero, and a fall time ($T_5$–$T_4$) of approximately 250 nanoseconds. Signal 202 may have a maximum current amplitude of approximately 3 milliamps, a rise time of approximately zero, and a fall time ($T_8$–$T_7$) of approximately 700 nanoseconds. Signal 203 may have a maximum current amplitude of approximately 3 milliamps, a rise time of approximately zero, and a fall time ($T_{11}$–$T_{10}$) of approximately 2 microseconds.

As mentioned above, programming signal generator device 160 (FIG. 2) may be adapted to generate programming signals 200–203 to apply to memory cells 140–143. In some embodiments, device 160 may comprise a circuit to set the fall time of programming signals 200–203. In alternate embodiments, device 160 may comprise a circuit to set the fall time of a programming signal by setting the decay rate of the programming signal. In other embodiments, device 160 may comprise a circuit to set the fall time of a programming signal by shaping a slope of a trailing portion of the programming signal.

The decay rate may be defined as the rate at which a trailing portion of a signal decreases from its maximum amplitude to its minimum amplitude, and may be measured in terms of current per unit of time for signals 200–203. The decay rates of programming signals 200–203 may be increased to reduce the fall time of these programming signals. Conversely, the decay rates of programming signals 200–203 may be decreased to increase the fall time of these programming signals. In the embodiment illustrated in FIG. 3, signal 201 has a faster or greater decay rate than the decay rate of signal 202, and signal 202 has a faster decay rate than the decay rate of signal 203. In alternate embodiments, the decay rate of a programming signal may be polynomial, logarithmic, or exponential, etc., although the scope of the present invention is not limited in this respect.

In the embodiment illustrated in FIG. 3, the slopes of leading portion 211 and trailing portion 213 of signal 200 are set to be substantially vertical and the slope of intermediate portion 212 of signal 200 is set to be substantially horizontal. Signal 201 has a leading portion 215 that is set to a substantially vertical slope, an intermediate portion 216 that is set to a substantially horizontal slope and a trailing portion that is set to a negative linear slope.

According to an embodiment of the invention, a programming signal is shaped by setting the fall time so that the decaying or sloping trailing portion of the programming signal cools the phase change memory material at a rate sufficient to place the memory cell in a desired state of the multiple memory states. The fall time of the programming signal applied to a phase change material may be increased to reduce the resistance of the phase change material. Using this programming method, the resulting resistance of the phase change material is not determined by the amplitude of the programming signal, but rather by the fall time of the programming signal.

In some embodiments, device 160 may set an amplitude of a programming signal to an amplitude sufficient to heat the phase change material of a memory cell to an amorphizing temperature and place the phase change material in a substantially amorphous state. To keep the phase change material in the substantially amorphous state, the material may be rapidly cooled. This may be accomplished by having a relatively fast fall time for the applied programming signal. As an example, signal 200 may be used to place the phase change material of a memory cell in a substantially amorphous state, and signal 200 may have a maximum amplitude ($I_1$) of approximately 3 milliamps and a fall time of less than 2 nanoseconds.

Alternatively, to place the phase change material in a polycrystalline state, device 160 may set the amplitude of the programming signal to an amplitude sufficient to heat the phase change material to an amorphizing temperature, and set a fall time of the programming signal so that after the memory material reaches the amorphizing temperature, the phase change memory material may cool down at a sufficient rate so that the memory material may be placed in the polycrystalline state. As an example, signal 203 may be used to place a phase change material of a memory cell in a polycrystalline state, wherein signal 203 may have a maximum amplitude ($I_1$) of approximately 3 milliamps and a fall time of approximately 2 microseconds. In addition, to place the phase change material in an intermediate state between the substantially amorphous and polycrystalline states, device 160 may set the fall time of the programming signal so that after the memory material reaches the amorphizing temperature, the phase change material may cool down at a sufficient rate so that the memory material is placed in the intermediate state. As an example, signal 202 may be used to place the phase change material of a memory cell in an intermediate state, wherein signal 202 may have a maximum amplitude ($I_1$) of approximately 3 milliamps and a fall time of approximately 700 nanoseconds.

To avoid erasing memory cells prior to a write operation, in some embodiments, an overwrite operation may be implemented by heating the phase change material to an amorphizing temperature during a write operation, then controlling the fall time (or decay rate or trailing portion slope) of the signal to place the phase change material in different states, e.g., either a substantially amorphous state, a polycrystalline state, or a heterogeneous state. Programming in this fashion may allow for overwriting of the cell since the programming signal in this example may result in heating the phase change material to an amorphizing temperature, and depending on the fall time (or decay rate or slope of a trailing portion) of the signal, the material may either be placed in a substantially amorphous state, a substantially crystalline state, or an intermediate heterogeneous state.

As may be appreciated from the preceding discussion, application of signals 200–203 to memory cells 140–143 may heat and cool the phase change materials of memory cells 140–143 to set the resistance of the phase change materials, thereby setting the state of the associated memory cell. For MLC operation, wherein the phase change materials of memory cells 140–143 have more than two states, signals 200–203 may be used to set the state of the phase change material in a particular memory cell to one of the more than two states. For example, signal 200 may be used to place the phase change material of memory cell 140 to a substantially amorphous state, e.g., state (0,0);, signal 201 may be used to place the phase change material of memory cell 140 in an intermediate state, e.g., state (0,1); signal 202 may be used to place the phase change material of memory cell 140 in another intermediate state, e.g., state (1,0); and signal 203 may be used to place the phase change material of memory cell 140 in a substantially crystalline state, e.g., state (1,1).

In alternate embodiments, signals 200–203 may be used to set the state of a memory cell using a feedback approach. For example, to set memory cell 140 to an intermediate state (1,0), signal 202 may be initially applied to memory cell 140. Then, read device 150 may be used to perform a verify operation to determine if memory cell 140 was programmed to the selected state of (1,0). For example, read device 150 may measure the resistance of the phase change material of memory cell 140, and compare this resistance to a reference resistance to determine if the resistance of the phase change material is above or below the target resistance. After applying signal 202, the resistance of the phase change material may be reduced by applying signal 203 that has a greater fall time than the fall time of signal 202 or the resistance of the phase change material may be increased by applying signal 201 that has a smaller fall time than the fall time of signal 202. This iterative process of applying programming signals having different fall times to program memory cell 140 to one of at least three states may be repeated until the desired state (e.g., the desired resistance) of the phase change material is achieved.

Because of fabrication process and material variations in phase change memories, the actual temperature of the phase change material in an array of memory cells may vary from cell to cell for a given programming current signal. This variation may result in the phase change material in one or more of the memory cells to inadvertently program a memory cell to an erroneous state. In other words, variations in materials, manufacturing processes, and operating environment may result in different programming characteristics for the memory cells in a phase change memory, wherein the different programming characteristics include variations in resulting resistance of the phase change materials when a rectangular pulse having a predetermined amount of current is applied to these memory cells. In some embodiments, the fall time of a programming signal may be set so that that different memory cells having different programming characteristics (e.g., different resulting resistance vs. applied current) are placed in a selected state when the programming signal is applied to the different memory cells. In particular, the fall time of a programming signal may be set so that all memory cells that the programming signal is applied, sweep through a rapid crystallization temperature interval.

Figure 4:
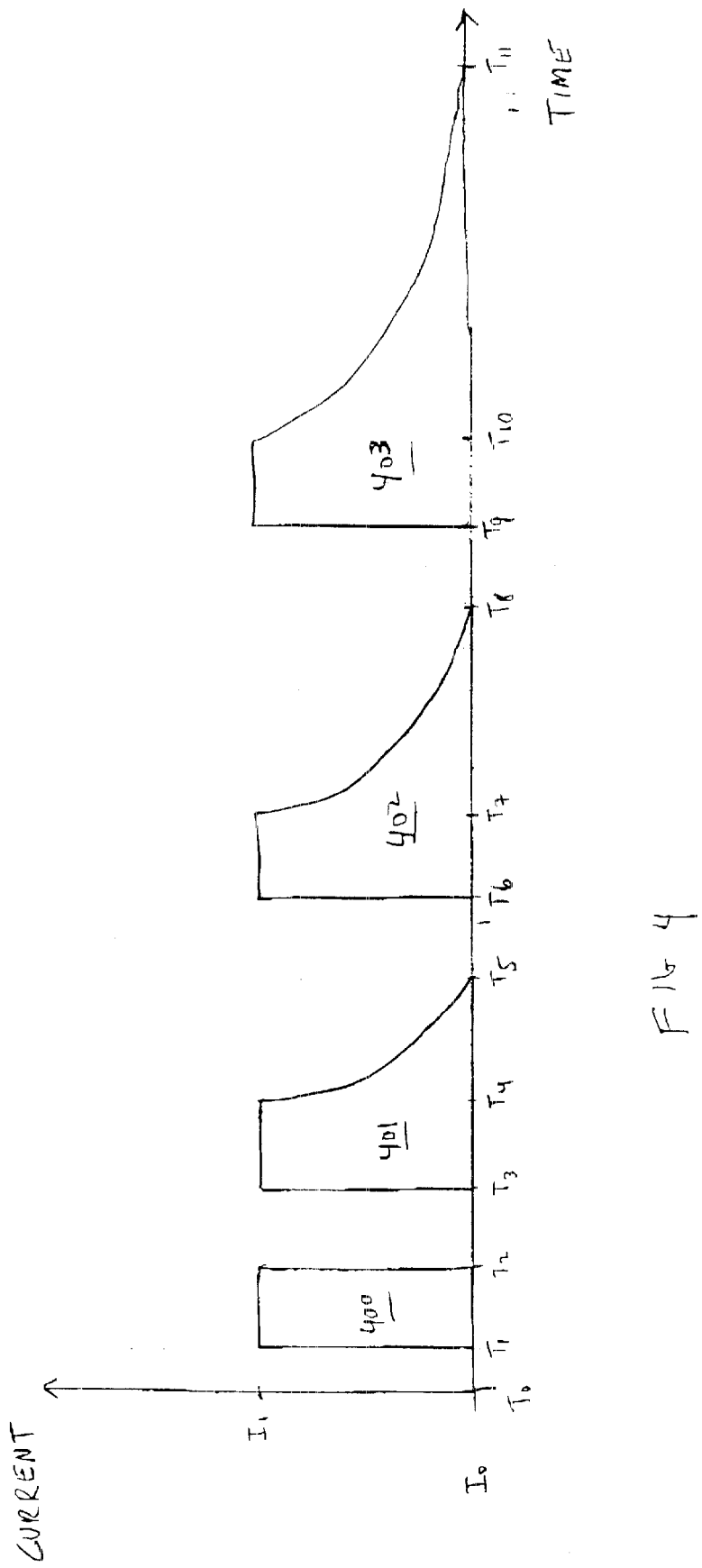
FIG. 4 illustrates another plurality of programming signals in accordance with another embodiment of the present invention.
Figure 5:
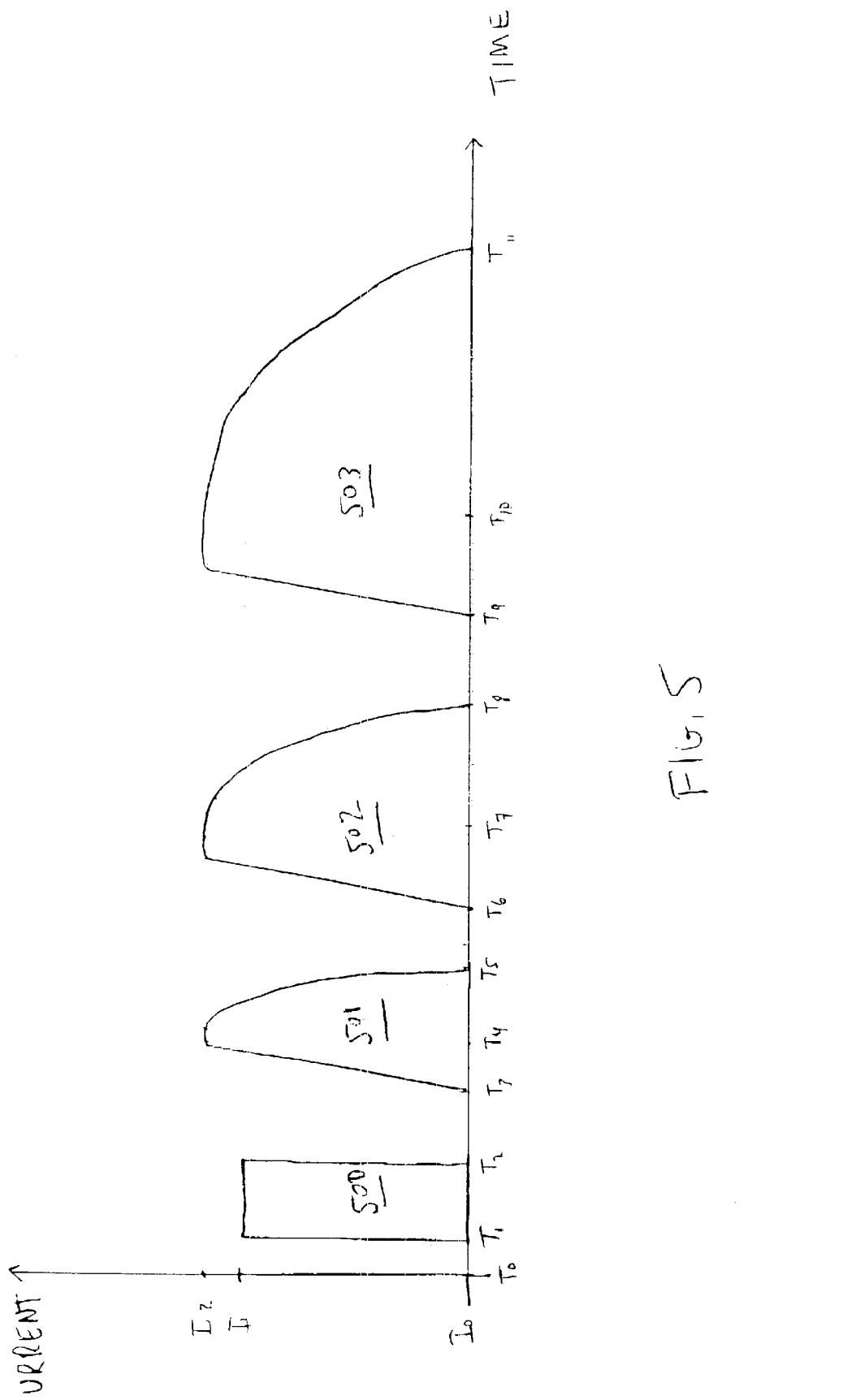
FIG. 5 illustrates another plurality of programming signals in accordance with another embodiment of the present invention.
Figure 6:
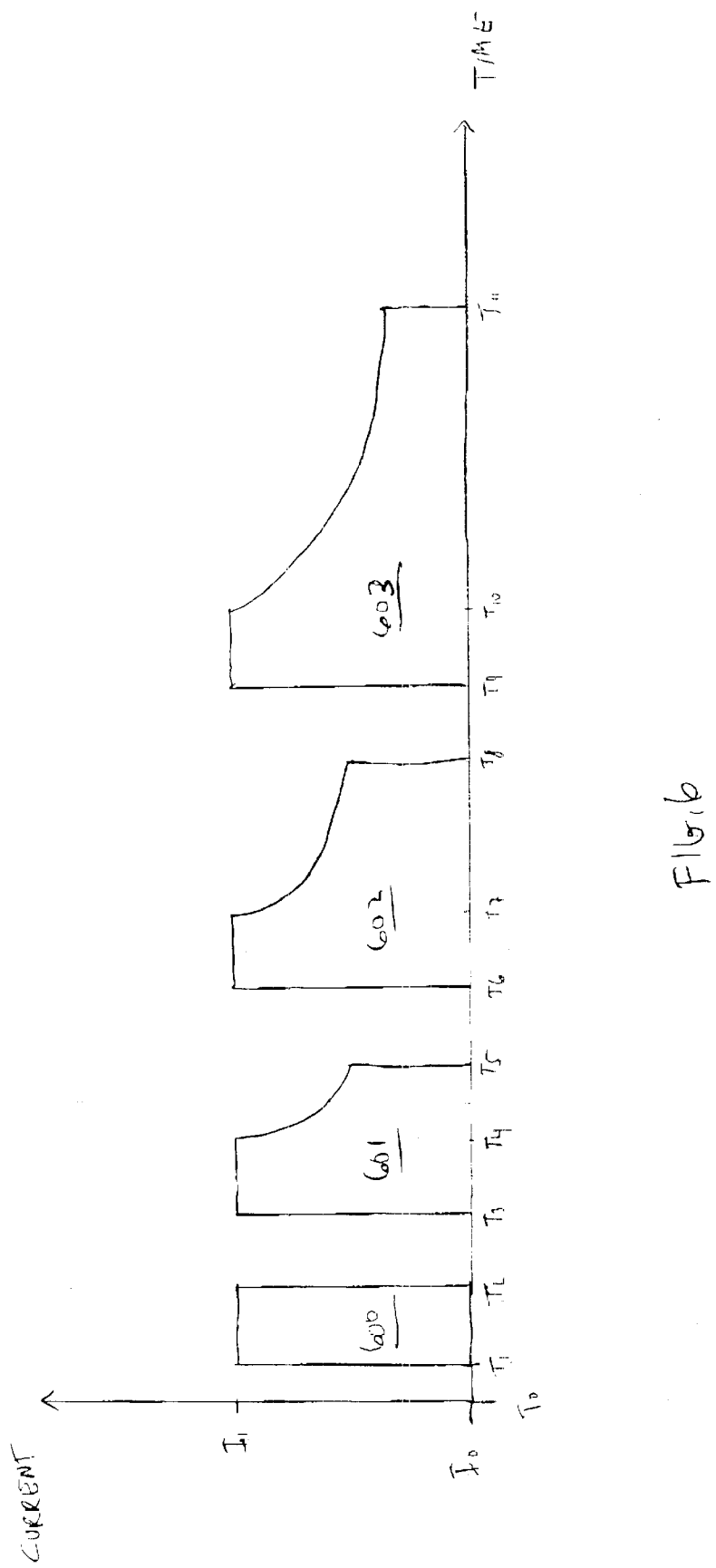
FIG. 6 illustrates yet another plurality of programming signals in accordance with another embodiment of the present invention.

FIGS. 4, 5, and 6 illustrate programming signals in accordance with other embodiments of the present invention. FIG. 4 includes signals 400, 401, 402, and 403 having successively greater fall times. For example, signal 400 may have a fall time of substantially zero. The fall time of signal 401 may be greater than the fall time of signal 400 and less than the fall time of signal 402, and the fall time of signal 402 may be less than the fall time of signal 403. In this embodiment, the slopes of the leading and trailing portions of signal 400 may be substantially vertical and the slope of the intermediate portion of signal 400 may be substantially horizontal. Signal 401 may have a leading portion that has a substantially vertical slope, an intermediate portion that has a substantially horizontal slope and a trailing portion having a negative nonlinear slope that varies with time. In particular, the slope of the trailing portion of signal 401 may decrease with time. Similarly, the slopes of the trailing portions of signals 402 and 403 may decrease with time.

FIG. 5 includes signals 500, 501, 502, and 503 having successively greater fall times. The slopes of the trailing portions of signals 501, 502, and 503 are negative, nonlinear, and vary with time. In this embodiment, the slopes of the trailing portions of signals 501, 502, and 503 increase with time. Also in this embodiment, the maximum amplitude ($I_1$) of signal 500 is different compared to the maximum amplitudes ($I_2$) of signals 501, 502, and 503. As an example, the maximum amplitude of signal 500 may be approximately 3 milliamps and the maximum amplitudes of signals 501, 502, and 503 may be approximately 3.5 milliamps.

FIG. 6 includes signals 600, 601, 602, and 603 having successively greater fall times. In this embodiment, the slopes of the trailing portions of signals 601–603 are negative and vary with time. In particular, the slopes of the trailing portions of signals 601–603 change from a decreasing negative linear slope to a substantially vertical slope, e.g., the slope of the trailing portion of signal 601 decreases with time between times $T_4$ and $T_5$ and is substantially vertical at time $T_5$.

Although the scope of the present invention is not limited in this respect, it should be pointed that that the programming signals of FIGS. 4–6 may be generated and applied in a similar manner to program memory cells 140–143 (FIG. 2) as the programming signals of FIG. 3, or any combination of the programming signals of FIGS. 3–6 may be used to program memory cells 140–143. For example, signal 200, 401, 502, and 603, having different fall times, may be used to program memory cells 140–143 to a desired state. Generally, for MLC operation, programming signal generator device 160 (FIG. 2) may generate any of the programming signals of FIGS. 3–6 and set the fall times of the programming signals to program the phase change memory material of memory cells 140–143 to one of at least three states.

Programming signal generator device 160 may include a circuit comprising a resistor and capacitor (not shown) to set the fall time of a programming signal. The resistor and capacitor may be chosen so that the resulting time constant of the resistor and capacitor sets the fall time of the programming signals. In alternate embodiments, device 160 may include a waveshaping circuit (not shown) comprising analog waveshaping circuits such as, for example, integrator/ramp circuits, exponential and logarithmic circuits, etc.

Read device 150 (FIG. 2) may include a circuit to read the information stored in the memory cells 140–143. As an example, read device 150 may include a circuit to route a current through memory cell 140 that results in a voltage developing across memory cell 140. This voltage may be proportional to the resistance exhibited by the memory cell. Thus, a higher voltage may indicate that the cell is in an amorphous state, e.g., a higher resistance state; and a lower voltage may indicate that the cell is in a polycrystalline state, e.g., a lower resistance state.

Figure 7:
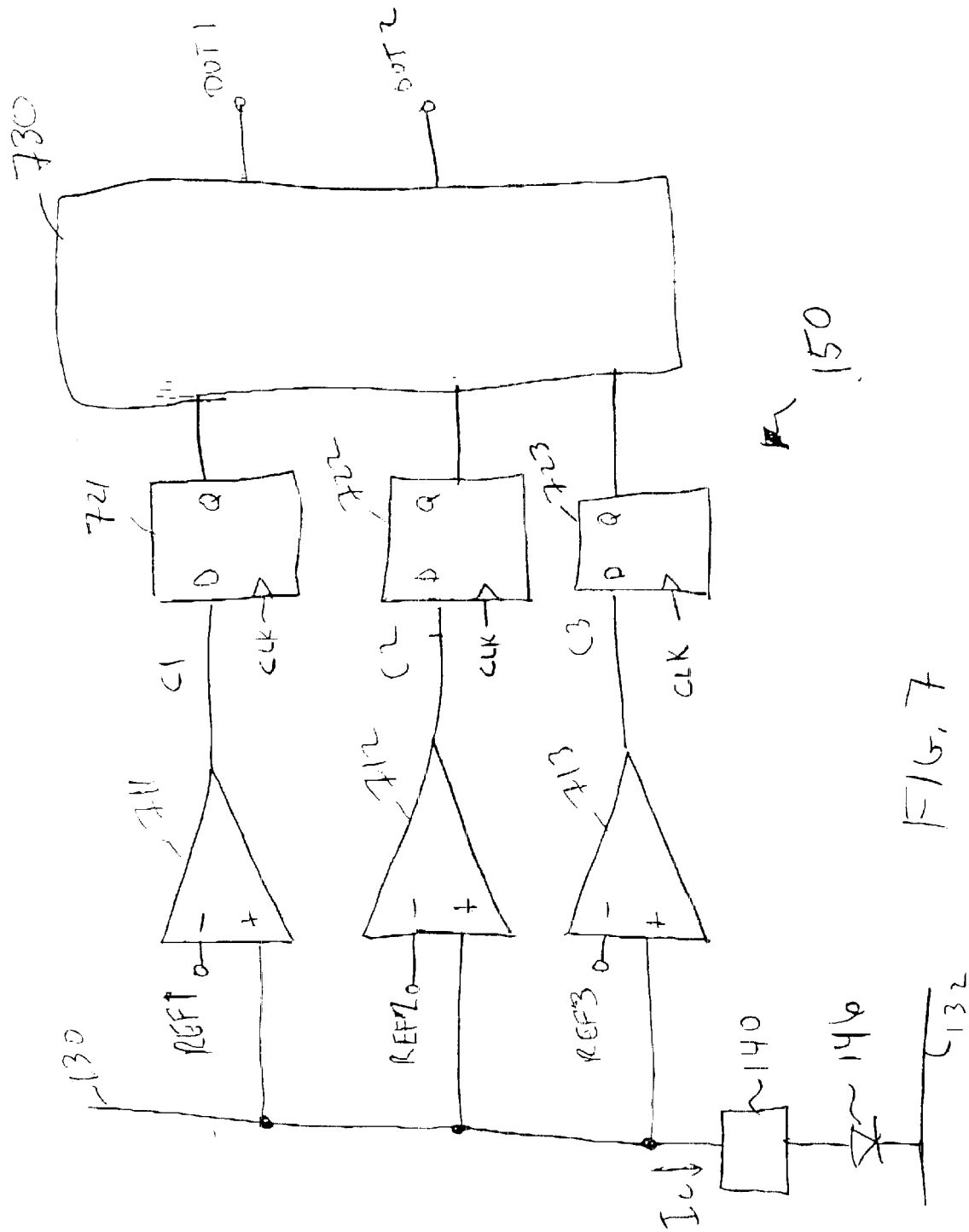
FIG. 7 illustrates a read circuit in accordance with an embodiment of the present invention.

Turning to FIG. 7, an embodiment of read device 150 in accordance with the present invention is provided. For binary MLC operation, three comparators 711, 712, and 713 may be used to detect a memory state of a particular memory cell, e.g., memory cell 140. The noninverting input terminals of a comparators 711–713 may be connected to memory cell 140 to receive an indication of the resistance of memory cell 140. The inverting input terminals of comparators 711, 712, and 713 may be connected to reference voltage signals REF1, REF2, and REF3, respectively. The output terminals of comparators 711, 712, and 713 may be connected to the D input terminals of D flip-flops 721, 722, and 723, respectively. A read current, labeled Ic, may be used to generate a read voltage that may be received at the noninverting input terminals of comparators 711–713. The read voltage is indicative of the resistance of memory cell 140, and therefore, may be used to indicate the state of memory cell 140.

The comparison of the read voltage to the reference voltages results in output signals C1, C2, and C3 that may be used to indicate the state of memory cell 140 and may be stored in flip-flops 721–723. The output terminals of flip-flops 721–723 may be connected to an encode circuit 730 that may generate signals OUT1 and OUT2 at its output terminals.

Reference voltage signals REF1, REF2, and REF3 have the following voltage relationship: REF1>REF2>REF3. As a result of this arrangement, for a relatively higher resistive amorphous state of memory cell 140, comparators 711, 712, and 713 may respectively generate output signals C1, C2, and C3 having a logic high voltage potential ("H"), and may be defined as state (0,0). Conversely, for a relatively lower resistive crystalline state of memory cell 140, comparators 711, 712, and 713 may respectively generate output signals C1, C2, and C3 having a logic low voltage potential ("L") and may be defined as state (1,1). The following truth table illustrates an embodiment of a truth table for encode circuit 730:

| C1 | C2 | C3 | OUT1 | OUT2 | State |
|---|---|---|---|---|---|
| L | L | L | 1 | 1 | (1, 1) |
| H | L | L | 1 | 0 | (1, 0) |
| H | H | L | 0 | 1 | (0, 1) |
| H | H | H | 0 | 0 | (0, 0) |

The timing associated with the generation of the programming signals may be determined by timing device 170 (FIG. 2). Timing device 170 provides control signals to programming signal generator device 160 and read device 150 so that devices 150 and 160 either measure the resistance of a memory cell (read operation or program verify operation) or provide the programming pulses at the correct timing to the selected memory cell. Accesses to the memory cell may be in random fashion where a memory cell may be accessed individually, or it may be on a row by row basis.

Figure 8:
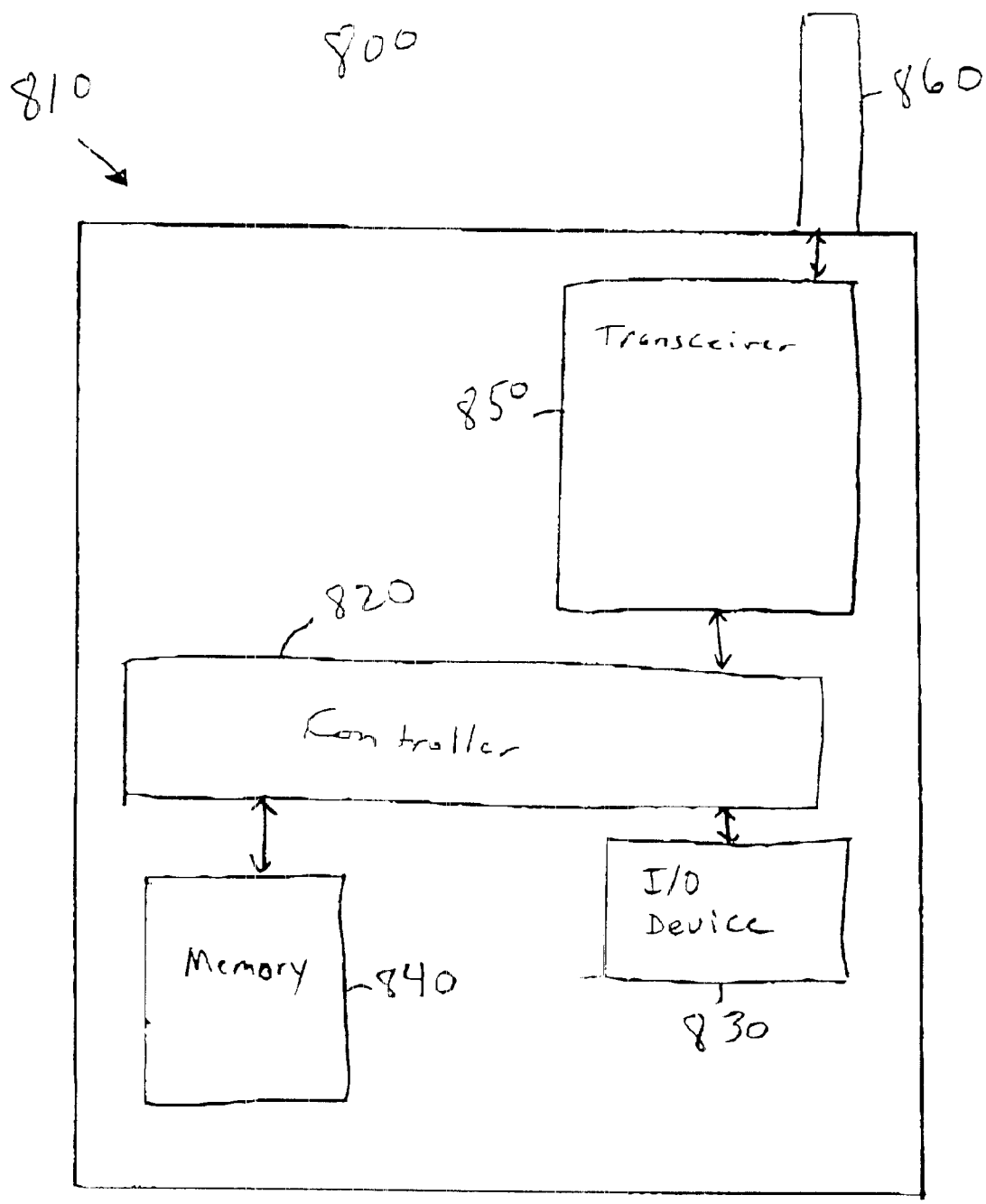
FIG. 8 is a block diagram of a portable communication device in accordance with an embodiment of the present invention.

Turning to FIG. 8, an embodiment 800 in accordance with the present invention is described. Embodiment 800 may comprise a portable communication device 810. Portable communication device 810 may include a controller 820, an input/output (I/O) device 830 (e.g. a keypad, display), a memory 840, and a transceiver 850 that may be connected to an antennae 860, although the scope of the present invention is not limited to embodiments having any or all of these components.

Controller 820 may comprise, for example, one or more microprocessors, digital signal processors, microcontrollers, or the like. Memory 840 may be used to store messages transmitted to or by portable communication device 810. Memory 840 may also optionally be used to store instructions that are executed by controller 820 during the operation of portable communication device 810, and may be used to store user data. Memory 840 may be provided by one or more different types of memory. For example, memory 840 may comprise a volatile memory (any type of random access memory), a non-volatile memory such as a flash memory and/or a phase change memory such as, for example, phase change memory 33 illustrated in FIG. 2.

I/O device 830 may be used by a user to generate a message. Portable communication device 810 may use transceiver 850 with antennae 860 to transmit and receive messages to and from a wireless communication network with a radio frequency (RF) signal.

Although the scope of the present invention is not limited in this respect, portable communication device 810 may use one of the following communication protocols to transmit and receive messages: Code Division Multiple Access (CDMA), cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method, comprising:
    applying a signal to a memory material having more than two states; and
    setting a fall time of the signal to place the memory material in one of the more than two states.

2. The method of claim 1, further comprising increasing the fall time to reduce a resistance of the memory material.

3. The method of claim 1, wherein setting the fall time includes setting the fall time of the signal to a first selected fall time to place the material in a first state of the more than two states, and the method further comprises:
    setting the fall time of the signal to a second selected fall time to place the memory material in a second state of the more than two states;
    setting the fall time of the signal to a third selected fall time to place the memory material in a third state of the more than two states; and
    setting the fall time of signal to a fourth selected fall time to place the memory material in a fourth state of the more than two states.

4. The method of claim 3, wherein the first selected fall time is less than the second selected fall time, the second selected fall time is less than the third selected fall time, and the third selected fall time is less than the fourth selected fall time.

5. The method of claim 3, wherein a conductivity of the memory material in the first state is less than a conductivity of the material in the second state, a conductivity of the memory material in the second state is less than a conductivity of the material in the third state, and a conductivity of the memory material in the third state is less than a conductivity of the material in the fourth state.

6. The method of claim 1, further comprising setting an amplitude of the signal to heat the memory material to an amorphizing temperature when the signal is applied to the memory material and wherein the fall time is set so that after the memory material reaches the amorphizing temperature, the memory material cool downs at a sufficient rate so that the memory material is placed in a first state of the more than two states, wherein the first state is a polycrystalline state.

7. The method of claim 1, wherein applying a signal includes applying a pulse having a leading portion that occurs prior to the signal reaching a maximum level and a trailing portion that occurs after the signal reaches the maximum level and wherein the fall time is the time for the trailing portion to decrease from the maximum level to the minimum level.

8. The method of claim 1, wherein setting the fall time of the signal comprises setting a slope of a trailing portion of the signal.

9. The method of claim 8, wherein setting the slope comprises setting the slope of the trailing portion to a negative slope.

10. The method of claim 8, wherein setting the slope includes setting a slope that varies with time.

11. The method of claim 8, wherein setting the slope comprises shaping the trailing portion to change from a negative slope to a substantially vertical slope.

12. The method of claim 8, wherein setting the slope comprises shaping the signal so that the signal is nonrectangular.

13. The method of claim 1, wherein setting the fall time includes setting a decay rate of the signal.

14. The method of claim 13, further comprising increasing the decay rate of the signal to reduce the fall time of the signal.

15. The method of claim 1, wherein the memory material is a phase change material.

16. The method of claim 1, further comprising applying a second signal to the memory material and applying a third signal to the memory material, wherein setting the fall time includes setting the fall time to be greater than a fall time of the second signal and less than a fall time of the third signal.

17. The method of claim 16, wherein the signal places the memory material in a first state of the more than two memory states when the signal is applied to the memory material, the second signal places the memory material in a second state of the more than two memory states when the second signal is applied to the memory material and wherein the third signal places the memory material in a third state of the more than two memory states when the third signal is applied to the memory material.

18. The method of claim 17, wherein the second state is a substantially amorphous state, the third state is a substantially crystalline state, and the first state is an intermediate state between the second and third states.

19. The method of claim 17, wherein a resistance of the memory material in the second state is greater than the resistance of the memory material in the first state and the resistance of the memory material in the first state is greater than the resistance of the memory material in the third state.

20. The method of claim 1, further comprising determining whether the memory material is in a selected state of the more than two states after the signal is applied to the memory.

21. The method of claim 20, wherein determining comprises comparing a resistance of the memory material to a reference resistance.

22. The method of claim 20, further comprising:
applying a second signal to the memory material if the memory material is not in the selected state, and
setting a fall time of the second signal to be greater than the fall time of the signal.

23. An apparatus, comprising:
a memory material having at least three states; and
a device to provide a signal to the memory material, wherein the device is adapted to set a fall time of the signal to program the memory material to one of the at least three states.

24. The apparatus of claim 23, wherein the device sets the fall time of the signal to a first selected fall time to program the memory material to a first state of the at least three states, the device sets the fall time of the signal to a second selected fall time to program the memory material to a second state of the at least three states, and the device sets the fall time of the signal to a third selected fall time to program the memory material to a third state of the at least three states.

25. The apparatus of claim 24, wherein the first selected fall time is less than the second selected fall time and the second selected fall time is less than the third selected fall time.

26. The apparatus of claim 24, wherein a resistance of the memory material in the first state is greater than the resistance of the memory material in the second state and the resistance of the memory material in the second state is greater than the resistance of the memory material in the third state.

27. The apparatus of claim 23, wherein the memory material is a phase change material.

28. The apparatus of claim 23, wherein the device increases the fall time to reduce a resistance of the memory material.

29. The apparatus of claim 23, wherein the device comprises a circuit to set the fall time of the signal by shaping a slope of a trailing portion of the signal.

30. The apparatus of claim 23, wherein the device comprises a circuit to set the fall time of the signal by setting a decay rate of the signal.

31. The apparatus of claim 23, wherein the device sets a fall time of the signal to program the memory material to a selected state of the at least three states and further comprising a circuit to determine whether the memory material is programmed to the selected state.

32. The apparatus of claim 31, wherein the circuit comprises:
a comparator having a first input coupled to the memory material and a second input coupled to receive a first reference signal and an output; and
a second comparator having a first input coupled to the memory material and a second input coupled to receive a second reference signal and an output.

33. The apparatus of claim 23, wherein the device is a circuit.

34. A system, comprising:

a controller;

a transceiver coupled to the controller;

a memory element having at least three states and coupled to the controller; and a device adapted to provide a signal to the memory element, wherein the device sets a decay rate of the signal to program the memory element to one of the at least three states.

35. The system of claim 34, wherein the device sets the decay rate of the signal to a first selected decay rate to program the memory element to a first state of the at least three states, the device sets the decay rate of the signal to a second selected decay rate to program the memory element to a second state of the at least three states, and the device sets the decay rate of the signal to a third selected decay rate to program the memory element to a third state of the at least three states.

36. The apparatus of claim 35, wherein the first selected decay rate is greater than the second selected decay rate and the second selected decay rate is greater than the third selected decay rate.

37. The apparatus of claim 36, wherein a conductivity of the memory element in the first state is less than the conductivity of the memory element in the second state and the conductivity of the memory element in the second state is less than the conductivity of the memory element in the third state.

* * * * *